US007671665B2

(12) United States Patent
Pratt

(10) Patent No.: US 7,671,665 B2
(45) Date of Patent: Mar. 2, 2010

(54) CONSTANT-ON STATE HIGH SIDE SWITCH CIRCUIT

(75) Inventor: Teryl Pratt, Morgan Hill, CA (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 135 days.

(21) Appl. No.: 12/165,911

(22) Filed: Jul. 1, 2008

(65) Prior Publication Data

US 2010/0001779 A1 Jan. 7, 2010

(51) Int. Cl.
*G05F 3/02* (2006.01)

(52) U.S. Cl. ........................................ 327/536; 363/60

(58) Field of Classification Search ................. 327/390, 327/536, 589; 363/59–60

See application file for complete search history.

(56) References Cited

U.S. PATENT DOCUMENTS 6,154,088 A * 11/2000 Chevallier et al. ........... 327/536
6,300,820 B1 * 10/2001 Fotouhi et al. .............. 327/536
6,456,513 B2 * 9/2002 Saito ........................... 363/59
6,469,571 B2 * 10/2002 Esterl et al. ................. 327/536
7,397,299 B2 * 7/2008 Ki et al. ...................... 327/536
7,439,793 B2 * 10/2008 Lee ............................ 327/536
2009/0195298 A1 * 8/2009 Nakai ......................... 327/536
2009/0315615 A1 * 12/2009 Likhterov ................... 327/536

* cited by examiner

*Primary Examiner*—Lincoln Donovan
*Assistant Examiner*—Thomas J Hiltunen
(74) *Attorney, Agent, or Firm*—Stephen G. Mican

(57) ABSTRACT

An electrical switching circuit for controlling current flow to an electrical load from a primary power source with a first electrical potential difference relative to a circuit ground comprising a primary energy storage device with a low side coupled to the electrical load, a secondary electrical energy storage device with a high side and a low side, a controllable electrical switch that toggles the low side of the secondary energy storage device from the circuit ground to the low side of the primary energy storage device, a primary unidirectional current gate coupled between the high side of the secondary energy storage device and the high side of the primary energy storage device to let current flow from the secondary energy storage device to the primary energy storage device when the potential difference of the high side of the secondary energy storage device is higher than the high side of the primary energy storage device, a secondary unidirectional current gate coupled between a secondary power source with an electrical potential difference of at least the predetermined potential relative to the circuit ground and the high side of the secondary energy storage device to let current flow from the secondary power source to the high side of the secondary energy storage device when the potential difference of the secondary power source is higher than the high side of the secondary energy storage device, wherein periodic operation of the secondary electrical switch charges the secondary energy storage device when the secondary switch toggles its low side to the circuit ground and the secondary energy storage device charges the primary storage device when the secondary switch toggles its low side to the low side of the primary energy storage device.

20 Claims, 2 Drawing Sheets

44 38 36 34 20 18 4 6 22 24 8 50 54 52 48 12 46 14 40 42 30 16 10

Figure 1
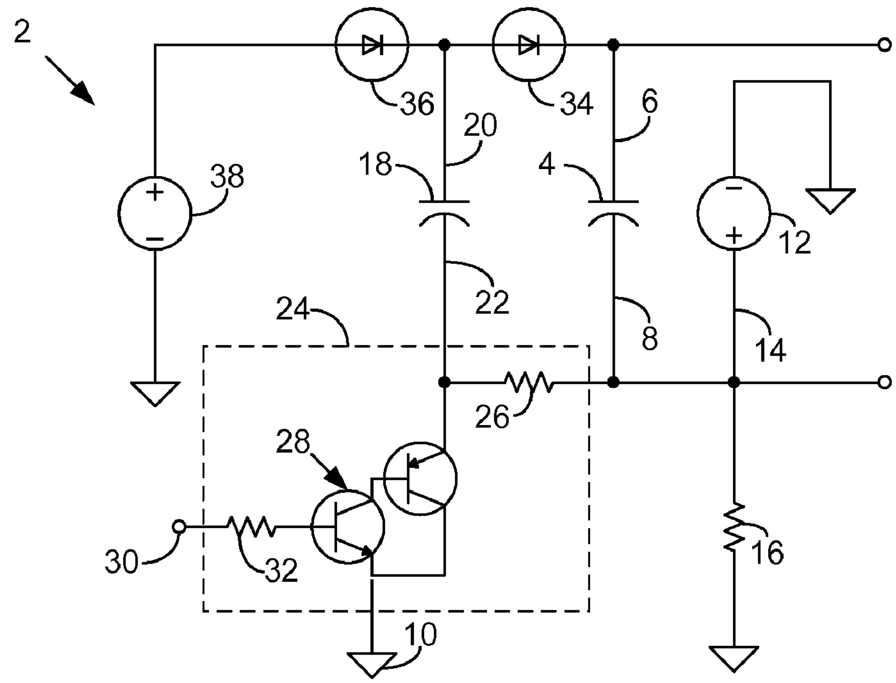
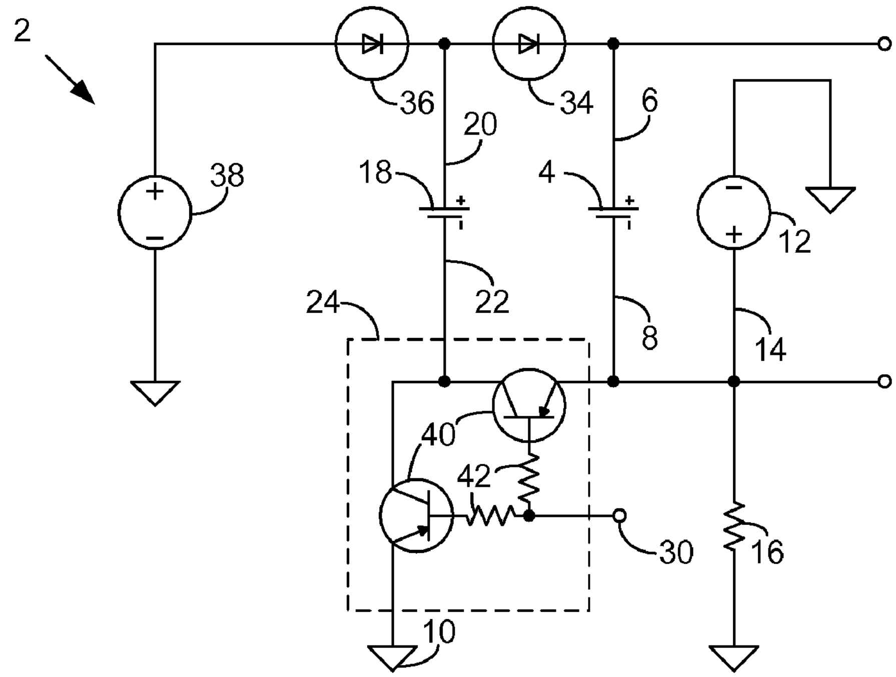
Figure 2

Figure 3
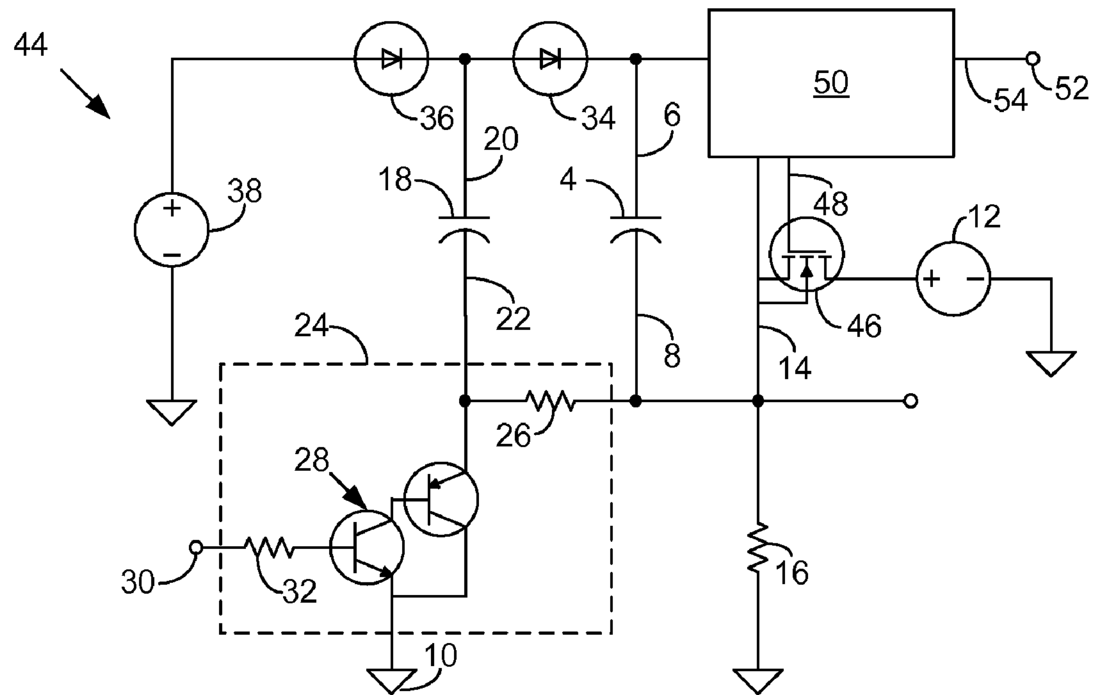
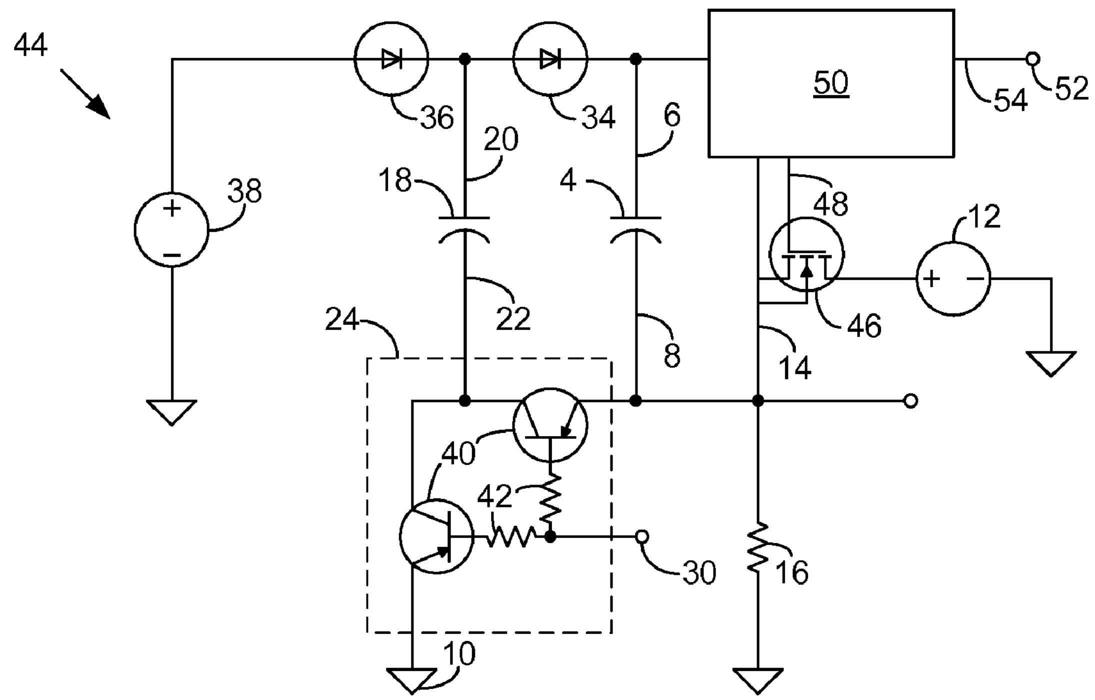
Figure 4

CONSTANT-ON STATE HIGH SIDE SWITCH CIRCUIT

FIELD OF THE INVENTION

The invention relates to electronic switch controllers, and more particularly to electronic switch controllers with bootstrap-operated floating channels.

BACKGROUND OF THE INVENTION

MOSFET and IGBT switching devices suitable for high power applications such as electric motor control generally control the flow of power from sources of relatively high electrical potential in the range of hundreds of volts. These switching devices require gate-to-source turn-on potentials in the range of about 10 volts. Standard high side switch controllers for these switching devices generate the required 10 volt gate-to-source potential with a bootstrap capacitor. A charging circuit charges the bootstrap capacitor through a load for the switching device through a diode. This charging circuit is suitable for applications in which the switching device uses pulse width modulated (PWM) switching of a load with a reasonable value of resistance. In such applications, the charging circuit recharges the bootstrap capacitor during the OFF state intervals of the PWM switching cycle.

If the load is not present or it has a very high value of resistance the charging circuit cannot properly keep the bootstrap capacitor charged. If the switching device is switched on statically (without PWM), there is no OFF state interval in which to charge the bootstrap capacitor. In such instances, the bootstrap capacitor discharges and the switching device remains off.

SUMMARY OF THE INVENTION

The invention generally comprises an electrical switching circuit for controlling current flow to an electrical load from a primary power source with a first electrical potential difference relative to a circuit ground, comprising: a primary electrical switch coupled between the primary power source and the electrical load with a control input that is responsive to a control signal of predetermined potential difference relative to the electrical load; a primary energy storage device with a low side coupled to the electrical load; a primary switch controller coupled to the primary energy storage unit with a controller output coupled the primary switch control input that develops a controller output signal that approximates the potential difference across the primary energy storage unit in response to a controller input signal; a secondary electrical energy storage device with a high side and a low side; a controllable electrical switch that toggles the low side of the secondary energy storage device from the circuit ground to the low side of the primary energy storage device; a primary unidirectional current gate coupled between the high side of the secondary energy storage device and the high side of the primary energy storage device to let current flow from the secondary energy storage device to the primary energy storage device when the potential difference of the high side of the secondary energy storage device is higher than the high side of the primary energy storage device; a secondary unidirectional current gate coupled between a secondary power source with an electrical potential difference of at least the predetermined potential relative to the circuit ground and the high side of the secondary energy storage device to let current flow from the secondary power source to the high side of the secondary energy storage device when the potential difference of the secondary power source is higher than the high side of the secondary energy storage device; wherein periodic operation of the secondary electrical switch charges the secondary energy storage device when the secondary switch toggles its low side to the circuit ground and the secondary energy storage device charges the primary storage device when the secondary switch toggles its low side to the low side of the primary energy storage device.

DESCRIPTION OF THE DRAWINGS

FIG. 1 is a schematic diagram of a charging circuit according to a possible embodiment of the invention.

FIG. 2 is a schematic diagram of a charging circuit according to another possible embodiment of the invention.

FIG. 3 is a schematic diagram of an electrical switching circuit according to a possible embodiment of the invention.

FIG. 4 is a schematic diagram of an electrical switching circuit according to another possible embodiment of the invention.

DETAILED DESCRIPTION OF THE INVENTION

FIG. 1 is a schematic diagram of a charging circuit 2 for a primary electrical energy storage unit 4 according to a possible embodiment of the invention. Depending upon application the primary energy storage unit 4 may comprise a device or devices of different types, such as a capacitor or storage cell. By way of example only, FIG. 1 shows the primary energy storage unit 4 as a capacitor. The primary energy storage unit 4 has a high side, represented by line 6, and a low side, represented by line 8, both of which may have electrical potential differences thereon that "float" relative to a circuit ground 10 for the charging circuit 2.

By way of example only, FIG. 1 shows a primary electrical power source 12 coupled to the low side 8 of the primary energy storage unit 4 by way of a primary source output line 14 that elevates or floats the low side 8 at a potential difference relative to the circuit ground 10 at a level equal to the output level of the primary source 12. Optionally, the primary power source 12 may supply power to an electrical load 16. The high side 6 of the primary energy storage unit 4 is thus at a level of potential difference relative to the circuit ground that approximates any potential difference between the high side 6 and the low side 8 plus the level of potential difference on the power source output line 14 relative to the circuit ground 6.

The charging circuit 2 comprises a secondary energy storage unit 18. Depending upon application the secondary energy storage unit 18 may comprise a device or devices of different types, such as a capacitor or storage cell. By way of example only, FIG. 1 shows the secondary energy storage unit 18 as a capacitor. The secondary energy storage unit 18 has a high side, represented by line 20, and a low side, represented by line 22.

A controllable electrical switch 24 toggles the low side 22 of the secondary energy storage device 18 from the circuit ground 10 to the low side 8 of the primary energy storage unit 4. The controllable switch 24 thus is or approximates a single pole, double throw electrical switch. Preferably, the switch 24 toggles in a periodic fashion with a selected frequency and duty cycle. The switch 24 may comprise a semiconductor switch, such as a semiconductor switch comprising a Sziklai pair switch configuration or a totem pole switch configuration.

By way of example only, FIG. 1 shows the switch 24 with a Sziklai pair configuration, wherein it comprises a coupling resistance 26 that couples the low side 8 of the primary energy storage unit 4 to the low side 22 of the secondary energy storage unit 18 and an NPN-PNP bipolar transistor Sziklai pair 28 coupled between the low side 22 of the secondary energy storage unit 18 and the circuit ground 10. A switch control signal, such as a periodic square wave control signal with a selected frequency and duty cycle coupled to the Sziklai pair 28 by means of a control input terminal 30 and Sziklai pair input resistance 32, may toggle the switch 24 in a synchronous periodic fashion.

A primary unidirectional current gate 34 couples the high side 20 of the secondary energy storage device 18 to the high side 6 of the primary energy storage device 4 to let current flow from the secondary energy storage device 18 to the primary energy storage device 4 when the potential difference of the high side 20 of the secondary energy storage device 18 is higher than the high side 6 of the primary energy storage device 4. The primary unidirectional current gate 34 may be a diode or any other two or more terminal device that may provide this function. By way of example only, FIG. 1 shows the primary unidirectional current gate 34 as a diode.

A secondary unidirectional current gate 36 couples a secondary electrical power source 38 and the high side 20 of the secondary energy storage device 18 to let current flow from the secondary power source 38 to the high side 20 of the secondary energy storage device 18 when the potential difference of the secondary power source 38 is higher than the high side 20 of the secondary energy storage device 18. The secondary unidirectional current gate 36 may be a diode or any other two or more terminal device that may provide this function. By way of example only, FIG. 1 shows the secondary unidirectional current gate 36 as a diode.

Periodic operation of the controllable switch 24, such as with a switch control signal that comprises a periodic square wave control signal with a selected frequency and duty cycle coupled to the control input terminal 30, may toggle the switch 24 in a synchronous periodic fashion charges the secondary energy storage device 18 when the switch 24 toggles its low side 22 to the circuit ground 10 and the secondary energy storage device 18 charges the primary storage device 4 when the switch 24 toggles its low side 22 to the low side 8 of the primary energy storage device 4.

FIG. 2 is a schematic diagram of the charging circuit 2 for a primary electrical energy storage unit 4 according to another possible embodiment of the invention. It is much the same as the embodiment hereinbefore described in connection with FIG. 1, but in this case the primary energy storage unit 4 and the secondary energy storage unit 18 are both electrical storage cells. This configuration may be useful when the electrical load 16 is of a very low value or when the switch 24 has a low periodic frequency, duty cycle, or both. This embodiment also shows the switch 24 in the form of a totem pole switch configuration, wherein a totem pole PNP bipolar transistor pair 40 toggles the low side 22 of the secondary energy storage unit 18 between the circuit ground 10 and the low side 8 of the primary energy storage unit 4. Again, a switch control signal, such as a periodic square wave control signal with a selected frequency and duty cycle coupled to the totem pole pair 40 by means of a control input terminal 30 and totem pole pair input resistances 42, may toggle the switch 24 in a synchronous periodic fashion. Alternately, the totem pole pair 40 may comprise MOSFETs.

Although the charging circuit 2 as hereinbefore described in connection with FIGS. 1 and 2 may be useful in a wide variety of applications that involve a floating output circuit, it is particularly useful as part of a high side electrical switching circuit. FIG. 3 is a schematic diagram of an electrical switching circuit 44 according to a possible embodiment of the invention. However, in this case a primary electrical power switch 46 couples the primary power source 12 and the electrical load 16. The primary electrical power switch 46 is preferably a semiconductor switching device, such as a MOSFET or IGBT. By way of example only, FIG. 3 shows the primary electrical power switch 46 as a MOSFET. The primary electrical power switch 46 has a control input on a power switch control input line 48.

The electrical switching circuit 44 also comprises a high-side primary power switch controller 50 coupled to the high side 6 and the low side 8 of the primary energy storage unit 4 with a controller output coupled to the primary switch control input on the power switch control input line 48 that develops a controller output signal that approximates the potential difference across the primary energy storage unit 4 in response to a controller input signal coupled to the switch controller 50 on a controller input terminal 52 by way of a controller input line 54. In this way, when the secondary power source 38 develops a level of potential difference that is sufficient to turn on the primary electrical power switch 46, the switch controller 50 may generate a controller output signal on the switch control input line 48 relative to the low side 8 of the primary energy storage unit 4 so that the primary electrical power switch 46 may turn on regardless of the level of potential difference on the low side 8 of the primary energy storage unit 4.

FIG. 4 is a schematic diagram of the electrical switching circuit 44 according to another possible embodiment of the invention. It is much the same as the embodiment of the electrical switching circuit 44 hereinbefore described in connection with FIG. 3. However, in this embodiment the switch 24 comprises a totem pole switch configuration as hereinbefore described in connection with the embodiment of the charging circuit 2 shown in FIG. 2.

The described embodiments of the invention are only some illustrative implementations of the invention wherein changes and substitutions of the various parts and arrangement thereof are within the scope of the invention as set forth in the attached claims.

The claimed invention is:

1. An electrical switching circuit for controlling current flow to an electrical load from a primary power source with a first electrical potential difference relative to a circuit ground, comprising:

a primary electrical switch coupled between the primary power source and the electrical load with a control input that is responsive to a control signal of predetermined potential difference relative to the electrical load;

a primary energy storage device with a low side coupled to the electrical load;

a primary switch controller coupled to the primary energy storage unit with a controller output coupled to the primary switch control input that develops a controller output signal that approximates the potential difference across the primary energy storage unit in response to a controller input signal;

a secondary electrical energy storage device with a high side and a low side;

a controllable electrical switch that toggles the low side of the secondary energy storage device from the circuit ground to the low side of the primary energy storage device;

a primary unidirectional current gate coupled between the high side of the secondary energy storage device and the high side of the primary energy storage device to let current flow from the secondary energy storage device to the primary energy storage device when the potential difference of the high side of the secondary energy storage device is higher than the high side of the primary energy storage device;

a secondary unidirectional current gate coupled between a secondary power source with an electrical potential difference of at least the predetermined potential relative to the circuit ground and the high side of the secondary energy storage device to let current flow from the secondary power source to the high side of the secondary energy storage device when the potential difference of the secondary power source is higher than the high side of the secondary energy storage device;

wherein periodic operation of the secondary electrical switch charges the secondary energy storage device when the secondary switch toggles its low side to the circuit ground and the secondary energy storage device charges the primary storage device when the secondary switch toggles its low side to the low side of the primary energy storage device.

2. The switching circuit of claim 1, wherein the primary switch comprises a semiconductor switch.

3. The switching circuit of claim 1, wherein the primary energy storage device comprises a capacitor.

4. The switching circuit of claim 1, wherein the secondary switch comprises a semiconductor switch.

5. The switching circuit of claim 1, wherein the secondary energy storage device comprises a capacitor.

6. The switching circuit of claim 1, wherein the primary unidirectional current gate comprises a diode.

7. The switching circuit of claim 1, wherein the secondary unidirectional current gate comprises a diode.

8. An electrical switching circuit for controlling current flow to an electrical load from a primary power source with a first electrical potential difference relative to a circuit ground, comprising:

a primary semiconductor switch coupled between the primary power source and the electrical load with a control input that is responsive to a control signal of predetermined potential difference relative to the electrical load;

a primary capacitor with a low side coupled to the electrical load;

a primary switch controller coupled to the primary capacitor with a controller output coupled to the primary switch control input that develops a controller output signal that approximates the potential difference across the primary energy storage unit in response to a controller input signal;

a secondary capacitor with a high side and a low side;

a second semiconductor switch that toggles the low side of the secondary capacitor from the circuit ground to the low side of the primary capacitor;

a primary diode coupled between the high side of the secondary capacitor and the high side of the primary capacitor to let current flow from the secondary capacitor to the primary capacitor when the potential difference of the high side of the secondary capacitor is higher than the high side of the primary capacitor;

a secondary diode coupled between a secondary power source with an electrical potential difference of at least the predetermined potential relative to the circuit ground and the high side of the secondary capacitor to let current flow from the secondary power source to the high side of the secondary capacitor when the potential difference of the secondary power source is higher than the high side of the secondary capacitor;

wherein periodic operation of the secondary switch charges the secondary capacitor when the secondary switch toggles its low side to the circuit ground and the secondary capacitor charges the primary capacitor when the secondary switch toggles its low side to the low side of the primary capacitor.

9. The switching circuit of claim 8, wherein the primary switch comprises a MOSFET.

10. The switching circuit of claim 8, wherein the primary switch comprises an IGBT.

11. The switching circuit of claim 8, wherein the secondary switch comprises a Sziklai pair switch configuration.

12. The switching circuit of claim 8, wherein the secondary switch comprises a totem pole switch configuration.

13. For a primary electrical energy storage device that has a low side coupled to a primary power source with a first electrical potential difference relative to a circuit ground and a secondary power source with a second electrical potential difference relative to the circuit ground, a charging circuit for the primary energy storage device to establish a high side of the primary energy storage device at an electrical potential difference relative to the circuit ground that approximates the combination of the first and second potential differences, comprising:

a secondary electrical energy storage device with a high side and a low side;

a controllable electrical switch that toggles the low side of the secondary energy storage device from the circuit ground to the low side of the primary energy storage device;

a primary unidirectional current gate coupled between the high side of the secondary energy storage device and the high side of the primary energy storage device to let current flow from the secondary energy storage device to the primary energy storage device when the potential difference of the high side of the secondary energy storage device is higher than the high side of the primary energy storage device; and a secondary unidirectional current gate coupled between the secondary power source and the high side of the secondary energy storage device to let current flow from the secondary power source to the high side of the secondary energy storage device when the potential difference of the secondary power source is higher than the high side of the secondary energy storage device;

wherein periodic operation of the electrical switch charges the secondary energy storage device when the switch toggles its low side to the circuit ground and the secondary energy storage device charges the primary storage device when the switch toggles its low side to the low side of the primary energy storage device.

14. The charging circuit of claim 13, wherein the electric switch comprises a semiconductor switch.

15. The charging circuit of claim 13, wherein the primary energy storage device comprises a capacitor.

16. The charging circuit of claim 13, wherein the primary energy storage device comprises a storage battery.

17. The charging circuit of claim 13, wherein the secondary energy storage device comprises a capacitor.

18. The charging circuit of claim 13, wherein the secondary energy storage device comprises a storage battery.

19. The charging circuit of claim 13, wherein the primary unidirectional current gate comprises a diode.

20. The charging circuit of claim 13, wherein the secondary unidirectional current gate comprises a diode.

* * * * *